United States Patent
Manabe et al.

(10) Patent No.: US 6,265,726 B1
(45) Date of Patent: Jul. 24, 2001

(54) LIGHT-EMITTING ALUMINUM GALLIUM INDIUM NITRIDE COMPOUND SEMICONDUCTOR DEVICE HAVING AN IMPROVED LUMINOUS INTENSITY

(75) Inventors: Katsuhide Manabe; Hisaki Kato; Michinari Sassa; Shiro Yamazaki; Makoto Asai; Naoki Shibata, all of Aichi-ken; Masayoshi Koike, Nakashima-gun, all of (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 09/379,621

(22) Filed: Aug. 24, 1999

Related U.S. Application Data

(62) Division of application No. 08/806,646, filed on Feb. 26, 1997, now Pat. No. 6,005,258, which is a continuation of application No. 08/408,164, filed on Mar. 21, 1995, now abandoned.

(30) Foreign Application Priority Data

Mar. 22, 1994 (JP) .......................................... 6-76514
Apr. 28, 1994 (JP) ......................................... 6-113484
Jul. 28, 1994 (JP) ......................................... 6-197914

(51) Int. Cl.$^7$ .............................. H01L 29/06; H01L 33/00
(52) U.S. Cl. .............................. 257/13; 257/87; 257/94; 257/101; 257/102; 257/103
(58) Field of Search .................................. 257/13, 87, 94, 257/101, 102, 103, 12, 96; 372/43, 45

(56) References Cited

U.S. PATENT DOCUMENTS

| | | |
|---|---|---|
| 5,247,533 | 9/1993 | Okazaki et al. . |
| 5,281,830 | 1/1994 | Kotaki et al. . |
| 5,408,120 | 4/1995 | Manabe et al. . |
| 5,578,839 | * 11/1996 | Nakamura et al. .................. 257/96 |

FOREIGN PATENT DOCUMENTS

| | | |
|---|---|---|
| 0607435 | 2/1994 | (EP) . |
| 599224 | 6/1994 | (EP) . |
| 0622858 | 11/1994 | (EP) . |
| 2-229475 | 9/1990 | (JP) . |

(List continued on next page.)

OTHER PUBLICATIONS

Nakamura et al., "P–GaN/N–InGaN/N–GaN Double–Heterostructure Blue–Light–Emitting Diodes", Japanese J of Applied Physics, Jan. 1993, vol. 32, No. 1A/B, Part 2, pp. L8–L11.

Nakamura et al., "Candela–class high–brightness InGaN/AlGaN double–heterostructure blue–light–emitting diodes", Applied Physics Letters, Mar. 1994, vol. 64, No. 13, pp. 1687–1689.

(List continued on next page.)

*Primary Examiner*—Minh Loan Tran
(74) *Attorney, Agent, or Firm*—Pillsbury Winthrop

(57) ABSTRACT

A light-emitting semiconductor device (10) consecutively includes a sapphire substrate (1), an AlN buffer layer (2), a silicon (Si) doped GaN n$^+$-layer (3) of high carrier (n-type) concentration, a Si-doped $(Al_{x3}Ga_{1-x3})_{y3}In_{1-y3}N$ n$^+$-layer (4) of high carrier (n-type) concentration, a zinc (Zn) and Si-doped $(Al_{x2}Ga_{1-x2})_{y2}In_{1-y2}N$ emission layer (5), and a Mg-doped $(Al_{x1}Ga_{1-x1})_{y1}In_{1-y1}N$ p-layer (6). The AlN layer (2) has a 500 Å thickness. The GaN n$^+$-layer (3) has about a 2.0 μm thickness and a $2 \times 10^{18}/cm^3$ electron concentration. The n$^+$-layer (4) has about a 2.0 μm thickness and a $2 \times 10^{18}/cm^3$ electron concentration. The emission layer (5) has about a 0.5 μm thickness. The p-layer 6 has about a 1.0 μm thickness and a $2 \times 10^{17}/cm^3$ hole concentration. Nickel electrodes (7, 8) are connected to the p-layer (6) and n$^+$-layer (4), respectively. A groove (9) electrically insulates the electrodes (7, 8). The composition ratio of Al, Ga, and In in each of the layers (4, 5, 6) is selected to meet the lattice constant of GaN in the n$^+$-layer (3). The LED (10) is designed to improve luminous intensity and to obtain purer blue color.

9 Claims, 13 Drawing Sheets

FOREIGN PATENT DOCUMENTS

| | | |
|---|---|---|
| 4106615 | 1/1992 | (JP) . |
| 410666 | 1/1992 | (JP) . |
| 410667 | 1/1992 | (JP) . |
| 4-68579 | 3/1992 | (JP) . |
| 4321280 | 11/1992 | (JP) . |
| 5291621 | 11/1993 | (JP) . |
| 62-68259 | 9/1994 | (JP) . |
| 7162038 | 6/1995 | (JP) . |

OTHER PUBLICATIONS

Nakamura et al., "High–brightness InGaN/AlGaN double–heterostructure blue–green–light–emitting diodes," J. of Applied Physics, Dec. 1994, vol. 76, No. 12, pp. 8189–8191.

Khan et al., "Effects Of Si On Photoluminescence of GaN", solid state communication, vol. 57, No. 6, pp. 405–409, 1986.

Matsushita et al., "PN Junction Type SiC Blue Light–Emitting Diodes", Applied Physics, vol. 60, No. 2, pp. 159–162, Feb. 1991.

Goldenberg et al. "Ultraviolet and violet light–emitting GaN diodes grown by low–pressure metalorganic chemical vapor deposition". Applied Physics Letters 62(1993) Jan., 25 No. 4 New York, New York.

Nakamura et al., "High–power InGaN/GaN double–heterostructure violet light emitting diodes," Applied Physics Letters, vol. 62, No. 19, May 10, 1993, pp. 2390–2392.

Patent Abstracts of Japan, vol. 018, No. 080 (E–1505), Feb. 9, 1994 & JP 05 291621 A (Nichia Chem Ind Ltd.), Nov. 5, 1993.

Patent Abstracts of Japan, vol. 018, No. 507 (E–1609), Sep. 22, 1994 & JP 06 177434 A (Nichia Chem Ind Ltd.), Jun. 24, 1994.

\* cited by examiner

LIGHT-EMITTING ALUMINUM GALLIUM INDIUM NITRIDE COMPOUND SEMICONDUCTOR DEVICE HAVING AN IMPROVED LUMINOUS INTENSITY

This is a division of application Ser. No. 08/806,646, filed Feb. 26, 1997, now U.S. Pat. No. 6,005,258, which is a continuation of 08/408,164 filed Mar. 21, 1995 now abandoned, the contents of which (i.e., both applications) are incorporated herein by reference.

BACKGROUND OF THE INVENTION

1. Field of the Invention

The present invention relates to a light-emitting semiconductor device that emits blue light and uses a group III nitrogen compound.

2. Description of the Prior Art

It has been known that an aluminum gallium indium nitride (AlGaInN) compound semiconductor may be used to obtain a light-emitting diode (LED) which emits blue light. This semiconductor device is useful because of its high luminous efficiency resulting from direct electron transition and because of its ability to emit blue light, which is one of the three primary colors.

Irradiating an electron beam into an i-layer to which magnesium (Mg) is doped and heat treatment is carried out enables the i-layer to have a p-type layer of the AlGaInN semiconductor device. As a result, a LED with a double hetero p-n junction structure includes an aluminum gallium nitride (AlGaN) p-layer, a zinc (Zn) doped indium gallium nitride (InGaN) emission layer and an AlGaN n-layer, becomes useful instead of a conventional LED of metal insulator semiconductor (MIS) structure which includes an n-layer and a semi-insulating i-layer.

The conventional LED with a double hetero p-n junction structure is doped with Zn as an emission center. Luminous intensity of this type of LED has been improved fairly. Still, there exists a problem in luminous efficiency and further improvement is necessary.

The emission mechanism of a LED with an emission layer doped with only Zn, or only an acceptor impurity, as the emission center is electron transition between conduction band and acceptor energy levels. However, a large difference of their energy levels makes recombination of electrons through deep levels dominant which deep level recombination does not contribute to emission. This results in lower luminous intensity. Further, the wavelength of light from the conventional LED is about 380 to 440 nm, or shorter than that of pure blue light.

Further, the emission layer doped with Zn as the emission center exhibits semi-insulative characteristics. Its emission mechanism is explained by recombination of an electron through acceptor level injected from an n-layer and a hole injected from a p-layer. However, the diffusion length of the hole is shorter than that of the electron. It results in high ratio of holes disappearing in a non-emission process before recombination of the hole and electron occurs in the emission layer. This phenomenon impedes higher luminous intensity.

SUMMARY OF THE INVENTION

It is an object of the present invention to solve the above problem and improve the luminous intensity of the LED of AlGaInN semiconductor, or obtain enough spectrum to emit a purer blue light.

According to the first aspect of the invention, there is provided a light-emitting semiconductor device comprising:

an n-layer with n-type conduction of group III nitride compound semiconductor satisfying the formula $Al_{x3}Ga_{y3}In_{1-x3-y3}N$, inclusive of x3=0, y3=0 and x3=y3=0, a p-layer with p-type conduction of group III nitride compound semiconductor satisfying the formula $Al_{x1}Ga_{y1}In_{1-x1-y1}N$, inclusive of x1=0, y1=0 and x1=y1=0, an emission layer of group III nitride compound semiconductor satisfying the formula $Al_{x2}Ga_{y2}In_{1-x2-y2}N$, inclusive of x2=0, y2=0 and x2=y2=0;

the junction layer of the n-layer, the p-layer, and the emission layer being any one of a homo-junction structure, a single hetero-junction structure, and a double hetero-junction structure; and wherein the emission layer is formed between the n-layer and the p-layer, and doped with both a donor and an acceptor impurity.

It is preferable that the donor impurity is one of the group IV elements and that the acceptor impurity is one of the group II elements.

Preferable combinations of a donor and an acceptor impurity include silicon (Si) and cadmium (Cd), silicon (Si) and zinc (Zn), and silicon (Si) and magnesium (Mg), respectively.

The emission layer can be controlled to exhibit any one of n-type conduction, semi-insulative, and p-type conduction depending on the concentration ratio of a donor impurity and an acceptor impurity doped thereto.

Further, the donor impurity can be one of the group VI elements.

Further, it is desirable to design the composition ratio of Al, Ga, and In in the n-layer, p-layer, and emission layer to meet each of the lattice constants of the three layers to an $n^+$-layer of high carrier concentration on which the three layers are formed.

Further, a double hetero-structure sandwiching of the emission layer of p-type conduction by the n-layer and p-layer improves luminous efficiency. Making the concentration of acceptor impurity larger than that of the donor impurity and processing by electron irradiation or heat treatment changes the emission layer to exhibit p-type conduction. Magnesium, an acceptor impurity, is especially efficient for obtaining p-type conduction.

Further, doping any combinations of the described acceptor and donor impurity to an emission layer of p-type conduction also improves luminous efficiency. The luminous mechanism doped with acceptor and donor impurities is due to recombination of an electron at donor level and a hole at the acceptor level. This recombination occurs within the emission layer, so that luminous intensity is improved.

Further, a double hetero-junction structure of a triple-layer sandwiching the emission layer having a narrower bad gap by the n-layer and p-layer having a wider band gap improves luminous intensity. Since the emission layer and the p-layer exhibit p-type conduction, valence bands of those layers are successive even without applying external voltage. Consequently, holes readily highly exist within the emission layer. In contrast, conduction bands of the n-layer and the emission layer are not successive without applying an external voltage. Applying a voltage enables the conduction bands to be successive and electrons to be injected deeper into the emission layer. Consequently, the number of injected electrons into the emission layer increases ensuring recombination with holes and a consequent improvement in luminous intensity.

Other objects, features, and characteristics of the present invention will become apparent upon consideration of the following description in the appended claims with reference to the accompanying drawings, all of which form a part of the specification, and wherein referenced numerals designate corresponding parts in the various figures.

DETAILED DESCRIPTION OF THE PREFERRED EMBODIMENT

The invention will be more fully understood by reference to the following examples.

EXAMPLE 1

Figure 1:
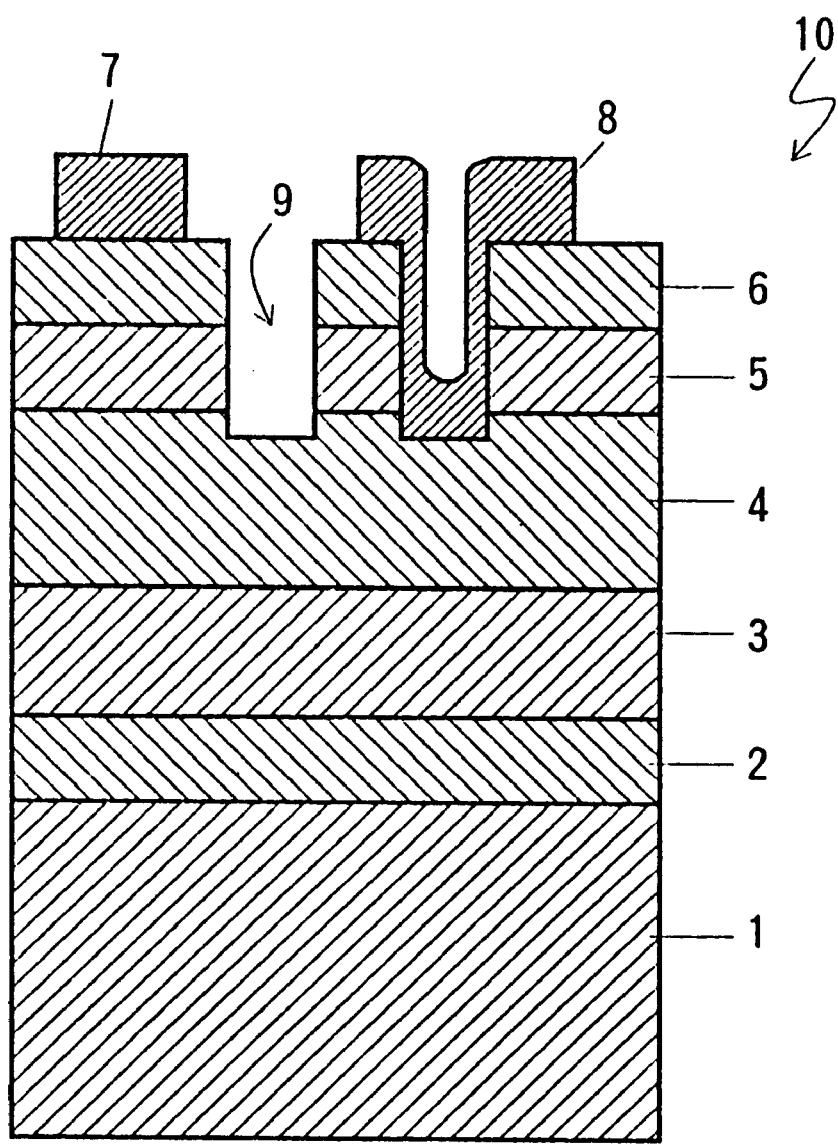
FIG. 1 is a diagram showing the structure of the LED embodied in Example 1.

FIG. 1 shows a LED 10 embodied in Example 1. It has a sapphire ($Al_2O_3$) substrate 1 upon which the following five layers are consecutively formed: an AlN buffer layer 2; a silicon (Si) doped GaN $n^+$-layer 3 of high carrier (n-type) concentration; a Si-doped $(Al_{x2}Ga_{1-x2})_{y2}In_{1-y2}N$ $n^+$-layer 4 of high carrier (n-type) concentration; a cadmium (Cd) and Si-doped $(Al_{x1}Ga_{1-x1})_{y1}In_{1-y1}N$ emission layer 5; and a Mg-doped $(Al_{x2}Ga_{1-x2})_{y2}In_{1-y2}N$ p-layer 6. The AlN layer 2 has 500 Å thickness. The GaN $n^+$-layer 3 is about 2.0 $\mu$m in thickness and has a $2\times10^{18}/cm^3$ electron concentration. The $n^+$-layer 4 is about 2.0 $\mu$m in thickness and has a $2\times10^{18}/cm^3$ electron concentration. The emission layer 5 is about 0.5 $\mu$m in thickness. The i-layer 6 is about 1.0 $\mu$m in thickness and has a $2\times10^{17}/cm^3$ hole concentration. Nickel electrodes 7 and 8 are connected to the p-layer 6 and the $n^+$-layer 4, respectively. They are electrically insulated by a groove 9.

The LED 10 is produced by gaseous phase growth, called metal organic vapor phase epitaxy referred to as MOVPE hereinafter.

The gases employed in this process are ammonia ($NH_3$), a carrier gas ($H_2$ or $N_2$), trimethyl gallium ($Ga(CH_3)_3$) (TMG hereinafter), trimethyl aluminum ($Al(CH_3)_3$) (TMA hereinafter), trimethyl indium ($In(CH_3)_3$) (TMI hereinafter), dimethylcadmium (($Cd(CH_3)_2$) (DMCd hereinafter), silane ($SiH_4$), diethylzinc (($C_2H_5)_2Zn$) (DEZ hereinafter) and biscyclopentadienyl magnesium ($Mg(C_5H_5)_2$) ($CP_2Mg$ hereinafter).

The single crystalline sapphire substrate 1, whose main surface 'a' was cleaned by an organic washing solvent and heat treatment, was placed on a susceptor in a reaction chamber for the MOVPE treatment. Then the sapphire substrate 1 was etched at 1100° C. by a vapor of $H_2$ fed into the chamber at a flow rate of 2 liter/min. under normal pressure for a period of 5 min.

On the etched sapphire substrate 1, a 500 Å thick AlN buffer layer 2 was epitaxially formed on the surface 'a' under conditions of lowering the temperature in the chamber to 400° C., keeping the temperature constant, and supplying $H_2$, $NH_3$ and TMA for a period of about 90 sec. at a flow rate of 20 liter/min., 10 liter/min., and $1.8\times10^{-5}$ mol/min., respectively. On the buffer layer 2, about a 2.2 $\mu$m thick Si-doped GaN $n^+$-layer 3 of high carrier concentration with an electron concentration of about $2\times10^{18}/cm^3$ was formed under conditions of keeping the temperature of the sapphire substrate 1 at 1150° C. and supplying $H_2$, $NH_3$, TMG, and diluted silane to 0.86 ppm by $H_2$ for thirty minutes at a flow rate of 20 liter/min., 10 liter/min., $1.7\times10^{-4}$ mol/min. and 200 ml/min., respectively.

The following manufacturing process provides for an emission layer 5 as an active layer, an $n^+$-layer 4 of high carrier concentration, and a p-layer 6 as a clad layer; the LED 10 is designed to emit at a 450 nm wavelength peak in the luminous spectrum and have luminous centers of Cd and Si.

On the $n^+$-layer 3, about a 0.5 $\mu$m thick Si-doped $(Al_{0.47}Ga_{0.53})_{0.9}In_{0.1}N$ $n^+$-layer 4 of high carrier concentration with an electron concentration of $1\times10^{18}/cm^3$ was formed under conditions of keeping the temperature of the sapphire substrate 1 at 850° C. and supplying $N_2$ or $H_2$, $NH_3$, TMG, TMA, TMI, and diluted silane to 0.86 ppm by $H_2$ for 60 min. at a flow rate of 10 liter/min., 10 liter/min., $1.12\times10^{-4}$ mol/min., $0.47\times10^{-4}$ mol/min., $0.1\times10^{-4}$ mol/min. and $10\times10^{-9}$ mol/min., respectively.

On the $n^+$-layer 4, about a 0.5 $\mu$m thick Cd and Si-doped $(Al_{0.3}Ga_{0.7})_{0.94}In_{0.06}N$ emission layer 5 was formed under conditions of keeping the temperature of the sapphire substrate 1 at 850° C. and supplying $N_2$ or $H_2$, $NH_3$, TMG, TMA, TMI, DMCd, and diluted silane to 0.86 ppm by $H_2$ for 60 min. at a flow rate of 20 liter/min., 10 liter/min., $1.53\times10^{-4}$ mol/min., $0.47\times10^{-4}$ mol/min., $0.02\times10^{-4}$ mol/min., $2\times10^{-7}$ mol/min. and $10\times10^{-9}$ mol/min., respectively. At this stage, the layer 5 exhibited high resistivity. The impurity concentrations of the Cd and the Si doped to the emission layer 5 were $5\times10^{18}/cm^3$ and $1\times10^{18}/cm^3$, respectively.

On the emission layer 5, about a 1.0 $\mu$m thick Mg-doped $(Al_{0.47}Ga_{0.53})_{0.9}In_{0.1}N$ p-layer 6 was formed under conditions of keeping the temperature of the sapphire substrate 1 at 1000° C. and supplying $N_2$ or $H_2$, $NH_3$, TMG, TMA, TMI, and $CP_2Mg$ for 120 min. at a flow rate of 20 liter/min., 10 liter/min., $1.12\times10^{-4}$ mol/min., $0.47\times10^{-4}$ mol/min., $0.1\times10^{-4}$ mol/min. and $2\times10^{-4}$ mol/min., respectively. Resistivity of the p-layer 6 was $10^8$ $\Omega\cdot$cm or more exhibiting insulative characteristics. The impurity concentration of the Mg-doped into the p-layer 6 was $1\times10^{20}/cm^3$.

Figure 2:
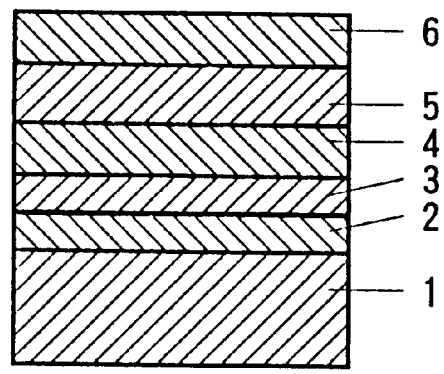
FIGS. 2 through 7 are sectional views illustrating successive steps of producing the LED embodied in Example 1.

Then, electron rays were uniformly irradiated into the p-layer 6 using a reflective electron beam diffraction device. The irradiation conditions were set at 10 KV for the accelerating voltage, 1 $\mu$A for the sample current, 0.2 mm/sec. for the speed of the beam scanning, 60 $\mu$m$\phi$ for the beam aperture, and at $5.0\times10^{-5}$ Torr vacuum. This irradiation changed the insulative p-layer 6 into a p-type conductive semiconductor with a hole concentration of $2\times10^{17}/cm^3$ and a resistivity of 2 $\Omega\cdot$cm. Thereby, a wafer with multi-structural layers was obtained as shown in FIG. 2.

The following FIGS. 3 to 7 show sectional views of an individual element on the wafer. In actual practice and in accordance with industry custom, a wafer with a large number of elements thereon is treated by the following process and divided or diced into individual elements.

Figure 3:
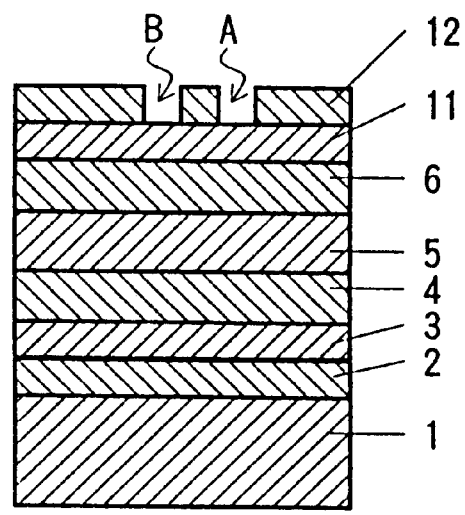
Figure 5:
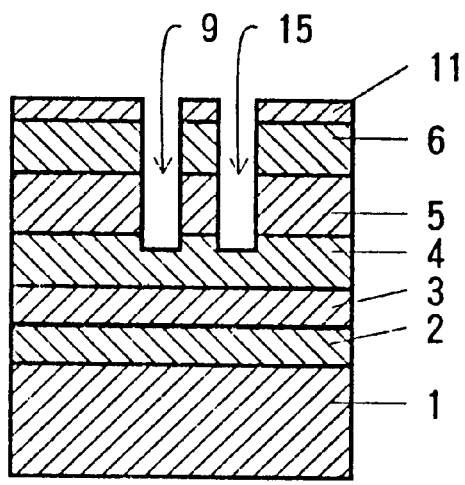

A 2000 Å thick $SiO_2$ layer 11 was formed on the p-layer 6 by sputtering. Then, the layer 11 was coated with a photoresist layer 12. Two selected parts or areas of the photoresist layer 12, named A and B, were removed by photolithography as shown in FIG. 3. The part or area A is an electrode forming part which corresponds to a place where a hole 15, shown in FIG. 5, is formed extending to and into the $n^+$-layer 4 of high carrier concentration. The part or area B corresponds to a place where a groove 9 shown in FIGS. 5 and 6 is formed for insulating or electrically insulating the part or area A from an electrode in contact with the p-layer 5.

Figure 4:
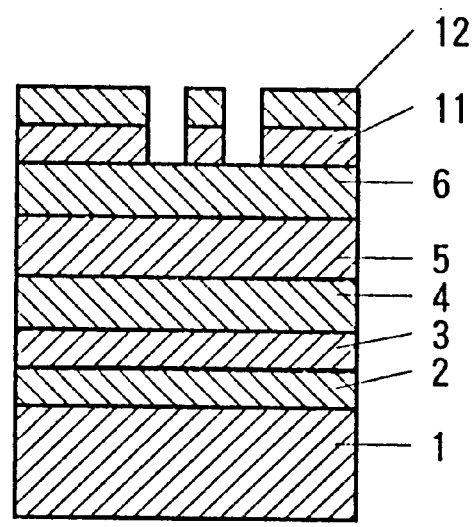

As shown in FIG. 4, two parts of the $SiO_2$ layer 11 which were not covered with the photoresist layer 12 were etched off by an etching liquid such as hydrofluoric acid. Then, the exposed part of the following successive three layers from the surface of the device, the p-layer 6, the emission layer 5, and the upper part of the $n^+$-layer 4 of high carrier concentration, were removed by dry etching, or supplying a high-frequency power density of 0.44 W/cm$^2$ and $BCl_3$ gas of 10 ml/min. at a vacuum degree of 0.04 Torr as shown in FIG. 5. After that, dry etching with argon (Ar) was carried out on the device. Consequently, a hole 15 for forming an electrode reaching the $n^+$-layer 4 of high carrier concentration and a groove 9 for insulation are formed.

Figure 6:
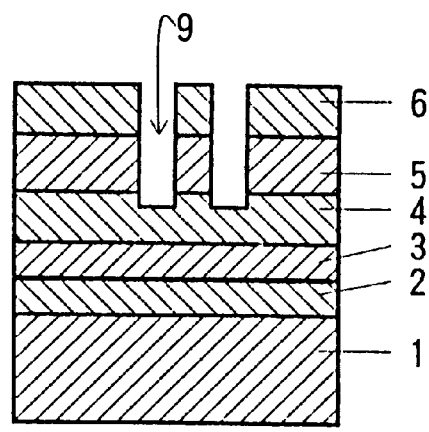
Figure 7:
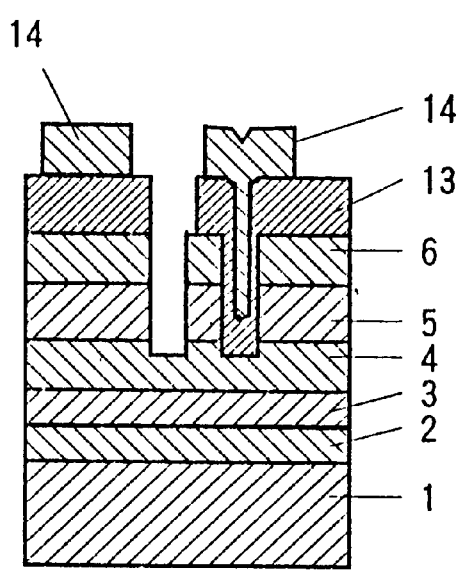

The $SiO_2$ layer 11 remaining on the p-layer 6 was removed by hydrofluoric acid as shown in FIG. 6. A nickel (Ni) layer 13 was laminated on the entire surface of the device by vapor deposition. Thus, the so-formed Ni layer 13 in the hole 15 is in electrical contact with the $n^+$-layer 4 of high carrier concentration. A photoresist 14 was deposited on the Ni layer 13 and, then, was selectively etched off by photolithography as shown in FIG. 7 leaving patterns of configuration for electrodes connected to the $n^+$-layer 4 of high carrier concentration and the p-layer 6, respectively.

Using the photoresist 14 as a mask, the exposed part or area of the Ni layer 13 from the photoresist 14 was etched off by an etching liquid such as nitric acid. At this time, the nickel layer 13 laminated in the groove 9 was also removed completely. Then, the photoresist layer 14 was removed by a photoresist removal liquid such as acetone. There were formed two electrodes, the electrode 8 for the $n^+$-layer 4 of high carrier concentration and the electrode 7 for the p-layer 6. A wafer treated with the above-mentioned process was divided or diced into each element which shows a gallium nitride light-emitting diode with a p-n junction structure as shown in FIG. 1.

The obtained LED 10 was found to have a luminous intensity of 100 mcd and a wavelength of 450 nm by driving current of 20 mA.

The emission layer 5 preferably contains impurity concentrations of Cd and Si within a range of $1 \times 10^{17}$/cm$^3$ to $1 \times 10^{20}$/cm$^3$, respectively, in order to improve luminous intensity. It is further desirable that the concentration of Si is smaller than that of Cd by ten to fifty percent.

In order to make the band gap of the emission layer 5 smaller than those of its respective adjacent two layers, i.e., the p-layer 6 and the $n^+$-layer 4 of high carrier concentration, a double hetero-junction structure was utilized for the LED 10 in this embodiment. Alternatively, a single hetero-junction structure can be utilized.

Further, it is preferable that the composition ratio of Al, Ga, and In in the respective three layers 4, 5, and 6 is selectively designed to meet the lattice constants of their layers 4, 5, and 6 with the lattice constant of GaN in the $n^+$-layer 3 of high carrier concentration as precisely as possible.

EXAMPLE 2

Figure 8:
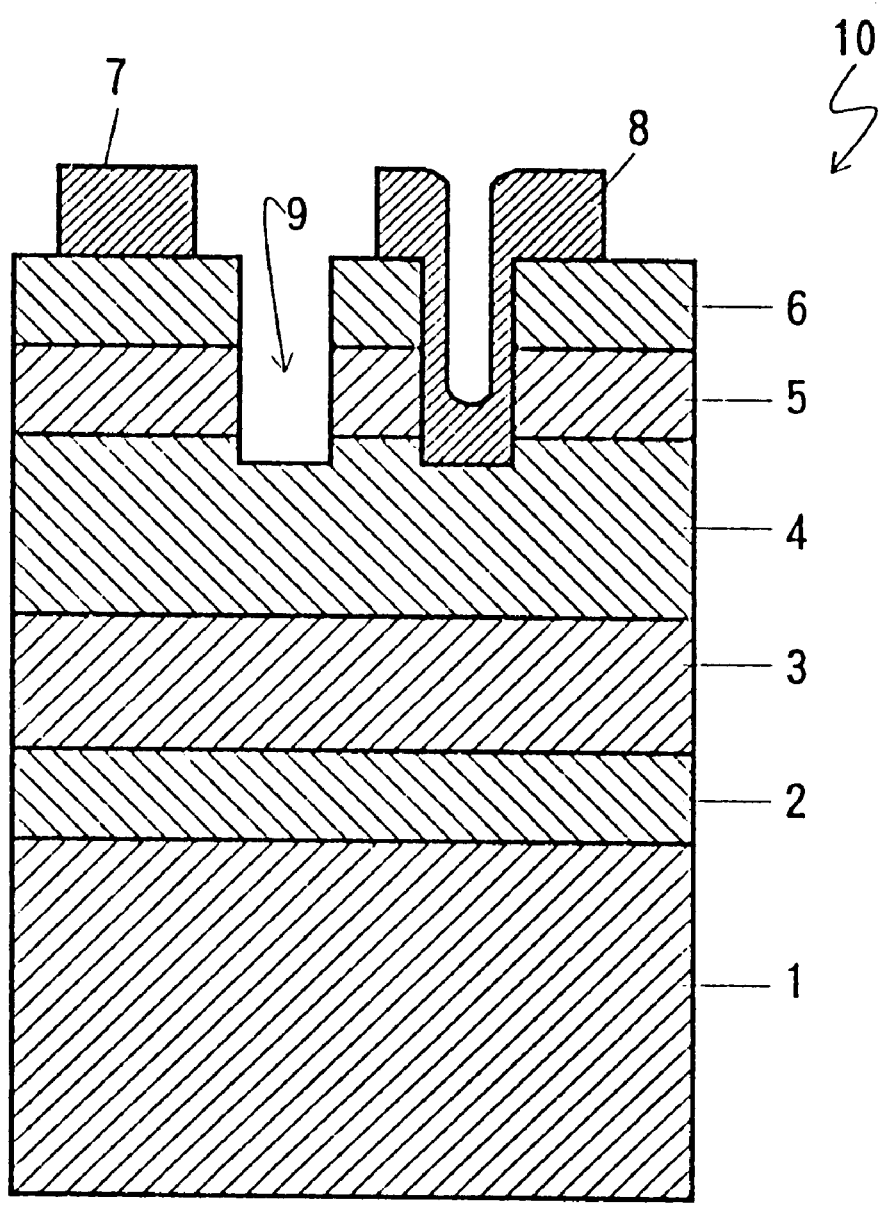
FIG. 8 is a diagram showing the structure of the LED embodied in Example 2.

FIG. 8 shows a LED 10 utilized in Example 2. The emission layer 5 in Example 1 was doped with Cd and Si. In this Example 2, an emission layer 5 is doped with Zn and Si.

A manufacturing process of a sapphire substrate 1, the formation of the AlN buffer layer 2 and the $n^+$-layers 3 was similar to that discussed in the previous example.

About a 0.5 μm thick Si-doped $(Al_{0.3}Ga_{0.7})_{0.94}In_{0.06}N$ $n^+$-layer 4 of high carrier concentration with an electron concentration of $2 \times 10^{19}$/cm$^3$ was formed on the $n^+$-layer 3 under conditions of lowering the temperature in the chamber to 800° C., keeping the temperature constant, and supplying $N_2$, $NH_3$, TMG, TMA, TMI, and diluted silane to 0.86 ppm by $H_2$ for 120 min. at a flow rate of 20 liter/min., 10 liter/min., $1.12 \times 10^{-4}$ mol/min., $0.47 \times 10^{-4}$ mol/min., $0.1 \times 10^{-4}$ mol/min., and $10 \times 10^{-9}$ mol/min., respectively.

About a 0.5 μm thick Si- and Zn-doped $(Al_{0.09}Ga_{0.91})_{0.99}In_{0.01}N$ emission layer 5 was formed on the $n^+$-layer 4 under conditions of lowering the temperature in the chamber to 1150° C., keeping it constant, and supplying $N_2$, $NH_3$, TMG, TMA, TMI, diluted silane to 0.86 ppm by $H_2$, and DEZ for 7 min. at a flow rate of 20 liter/min., 10 liter/min., $1.53 \times 10^{-4}$ mol/min., $0.47 \times 10^{-4}$ mol/min., $0.02 \times 10^{-4}$ mol/min. and $10 \times 10^{-9}$ mol/min., and $2 \times 10^{-4}$ mol/min., respectively. The impurity concentration of the Zn- and Si-doped into the emission layer 5 was $2 \times 10^{18}$/cm$^3$ and $1 \times 10^{18}$/cm$^3$, respectively.

About a 1.0 μm thick Mg-doped $(Al_{0.03}Ga_{0.7})_{0.94}In_{0.06}N$ p-layer 6 was formed on the emission layer 5 under conditions of lowering the temperature in the chamber to 1100° C., keeping the temperature constant, and supplying $N_2$, $NH_3$, TMG, TMA, TMI, and $CP_2Mg$ at a flow rate of 20 liter/min., 10 liter/min., $1.12 \times 10^{-4}$ mol/min., $0.47 \times 10^{-4}$ mol/min., $0.1 \times 10^{-4}$ mol/min., and $2 \times 10^{-4}$ mol/min., respectively. The impurity concentration of Mg doped into the p-layer 6 was $1 \times 10^{20}$/cm$^3$. At this stage, the p-layer 6 remained insulative with a resistivity of $10^8$ Ω·cm or more.

Then, the p-layer 6 was processed to have p-type conduction by electron beam irradiation under the same conditions described in Example 1. The subsequent process steps of forming the electrodes are the same as that described in the previous example. The so-obtained LED 10 was found to have a luminous intensity of 1000 mcd and a wavelength of 450 nm by driving current of 20 mA.

EXAMPLE 3

Figure 9:
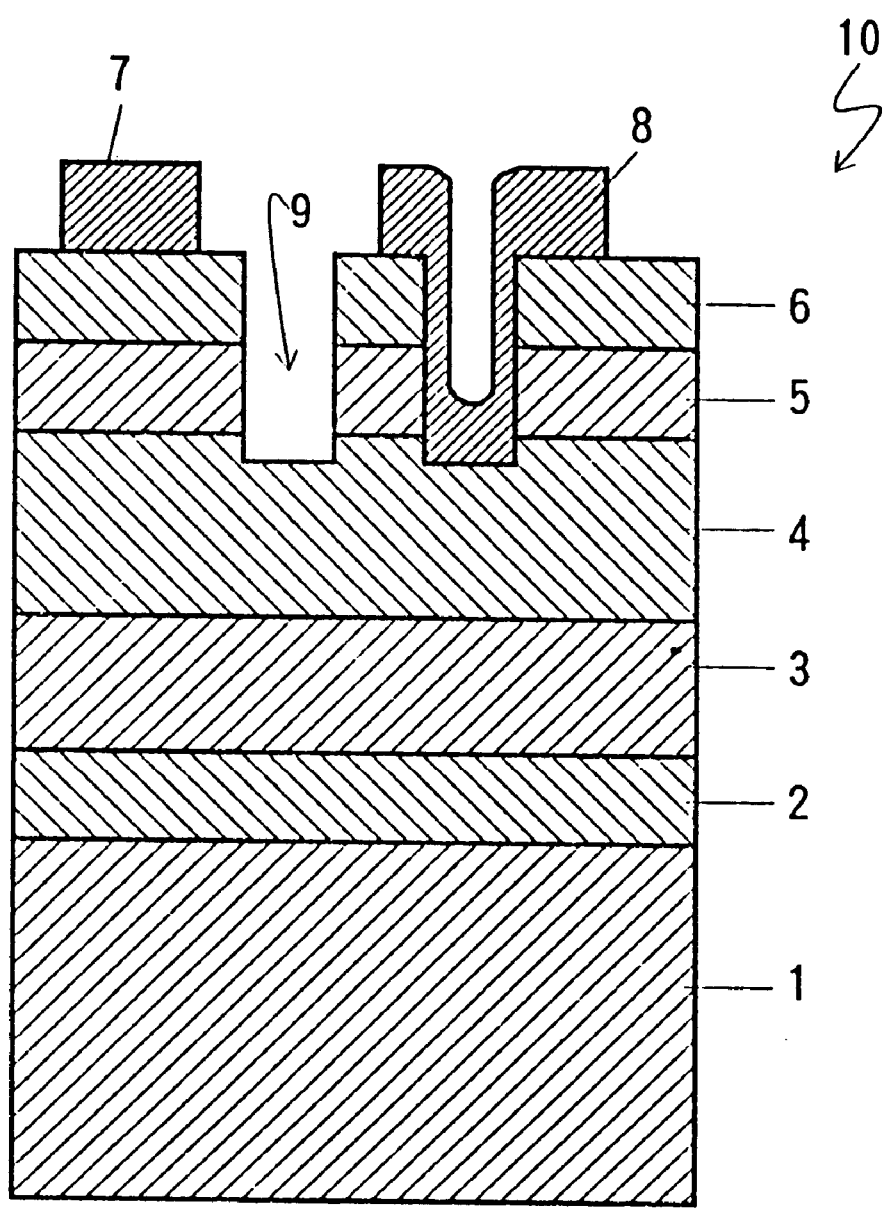
FIG. 9 is a diagram showing the structure of the LED embodied in Example 3.

FIG. 9 shows a structural view of a LED 10 embodied in Example 3. The LED 10 in Example 3 was manufactured by additionally doping Mg to the emission layer 5 of the LED in Example 2. Other layers and electrodes were manufactured in the same way as those in Example 2.

$CP_2Mg$ was fed at a flow rate of $2 \times 10^{-4}$ mol/min. into a chamber in addition to the gasses employed in Example 2 in order to manufacture the emission layer 5 in Example 3. The emission layer 5 was about 0.5 μm thick comprising Mg, Zn, and Si-doped $(Al_{0.09}Ga_{0.91})_{0.99}In_{0.01}N$. Its resistivity was $10^8$ Ω·cm remaining insulative. Impurity concentration of Mg, Zn, and Si was $1 \times 10^{19}$/cm$^3$, $2 \times 10^{18}$/cm$^3$, and $1 \times 10^{18}$/cm$^3$, respectively.

Then, both of the emission layer 5 and a p-layer 6 were subject to electron beam irradiation with the electron beam diffraction device under as same conditions as in Example 1. Thus, the emission layer 5 and the p-layer 6 turned into layers exhibiting p-type conduction with a hole concentration of $2\times10^{17}/cm^3$ and resistivity of 2 Ω·cm.

EXAMPLE 4

Figure 10:
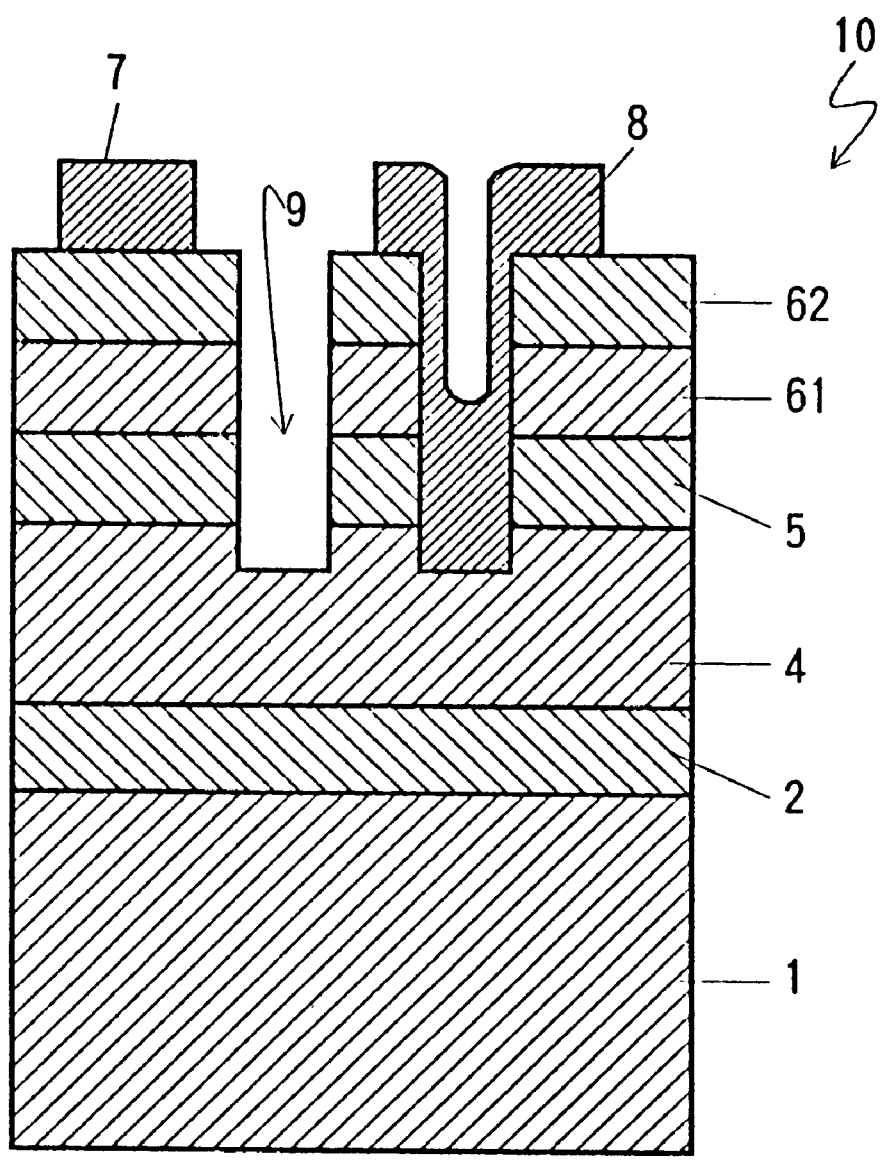
FIG. 10 is a diagram showing the structure of the LED embodied in Example 4.

FIG. 10 shows a structural view of a LED 10 embodied in Example 4. In this example, an emission layer 5 includes GaN and had a single hetero-junction structure. Namely, one junction comprises a heavily Si-doped n$^+$-layer 4 of high carrier concentration and a Zn- and Si-doped GaN emission layer 5, and another junction includes the GaN emission layer 5 and a Mg-doped $Al_{0.1}Ga_{0.9}N$ p-layer 61 with p-type conduction. In this example, the Mg-doped GaN p-layer 62 as a contact layer is formed on the p-layer 61. An insulation groove 9 is formed through the contact layer 62, the p-layer 61 and the emission layer 5.

The LED 10 in this example has a sapphire substrate 1 upon which the following five layers are consecutively formed: an AlN buffer layer 2; a Si-doped GaN n$^+$-layer 4 of high carrier (n-type) concentration; a Zn and Si-doped GaN emission layer 5, Mg-doped $Al_{0.1}Ga_{0.9}N$ p-layer 61, and Mg-doped GaN contact layer 62. The AlN layer 2 has a 500 Å thickness. The GaN n$^+$-layer 4 has about a 4.0 μm thickness and a $2\times10^{18}/cm^3$ electron concentration. The emission layer 5 has about a 0.5 μm thickness. The p-layer 61 has about a 0.5 μm thickness and a $2\times10^{17}/cm^3$ hole concentration. The contact layer 62 has about a 0.5 μm thickness and a $2\times10^{17}/cm^3$ hole concentration. Nickel electrodes 7 and 8 are formed to connect to the contact layer 62 and the n$^+$-layer 4 of high carrier concentration, respectively. The two electrodes are electrically insulated by a groove 9.

Here is explained a manufacturing process of the LED 10. The sapphire substrate 1 and the AlN buffer layer 2 were prepared by the same process described in detail in Example 1. On the AlN buffer layer 2, about a 4.0 μm thick Si-doped GaN n$^+$-layer 4 of high carrier concentration with an electron concentration of $2\times10^{18}/cm^3$ was formed under conditions of lowering the temperature in the chamber to 1150° C., keeping the temperature constant and supplying $N_2$, $NH_3$, TMG, and diluted silane to 0.86 ppm by $H_2$ for 60 min. at a flow rate of 20 liter/min., 10 liter/min., $1.7\times10^{-4}$ mol/min., $0.47\times10^{-4}$ mol/min., $0.1\times10^{-4}$ mol/min., and $10\times10^{-9}$ mol/min., respectively.

The following manufacturing process and composition ratio provide for the three layers, the emission layer 5 as an active layer, the p-layer 62 as a clad layer, and the contact layer 62. The LED is designed to have 430 nm wavelength at peak in the luminous spectrum and have luminous centers of Zn and Si.

About a 0.5 μm thick Zn- and Si-doped GaN emission layer 5 was formed on the n$^+$-layer 4 under conditions of lowering the temperature in the chamber to 1000° C., keeping it constant and supplying $N_2$ or $H_2$, $NH_3$, TMG, DMZ, and diluted silane to 0.86 ppm by $H_2$ for 8 min. at a flow rate of 20 liter/min., 10 liter/min., $1.53\times10^{-4}$ mol/min., $2\times10^{-7}$ mol/min., and $10\times10^{-9}$ mol/min., respectively.

About a 0.5 μm thick Mg-doped $Al_{0.1}Ga_{0.9}N$ p-layer 61 was formed on the emission layer 5 under conditions of lowering the temperature in the chamber to 1000° C., keeping the temperature constant and supplying $N_2$ or $H_2$, $NH_3$, TMG, TMA, and $CP_2Mg$ for 7 min. at a flow rate of 20 liter/min., 10 liter/min., $1.12\times10^{-4}$ mol/min., $0.47\times10^{-4}$ mol/min., and $2\times10^{-7}$ mol/min., respectively. At this stage, the p-layer 61 remained insulative with a resistivity of $10^8$ Ω·cm or more. The impurity concentration of the Mg-doped into the p-layer 61 was $1\times10^{19}/cm^3$.

Then, about a 0.5 μm thick Mg-doped GaN contact layer 62 was formed on the p-layer 61 under conditions of lowering the temperature in the chamber to 1000° C., keeping the temperature constant and supplying $N_2$ or $H_2$, $NH_3$, TMG, and $CP_2Mg$ for 10 min. at a flow rate of 20 liter/min., 10 liter/min., $1.12\times10^{-4}$ mol/min., and $2\times10^{-4}$ mol/min., respectively. At this stage, the Mg-doped contact layer 62 remained insulative with a resistivity of $10^8$ Ω·cm or more. The impurity concentration of the Mg-doped into the contact layer 62 was $1\times10^{20}/cm^3$.

Then, the p-layer 61 and contact layer 62 were uniformly irradiated by an electron beam under the same conditions as described in Example 1. Consequently, the p-layer 61 and contact layer 62 are processed to exhibit p-type conduction with a $2\times10^{17}/cm^3$ hole concentration and 2 Ω·cm or more resistivity. The subsequent process steps of forming the electrodes is the same as that described in the previous example. As a result, the LED 10 having a single hetero-junction structure is obtained whose emission layer is doped with Zn as an acceptor and Si as a donor impurity. Alternatively, doping Mg and irradiating electrons into the emission layer 5 can be used to obtain an emission layer 5 with p-type conduction.

EXAMPLE 5

Figure 11:
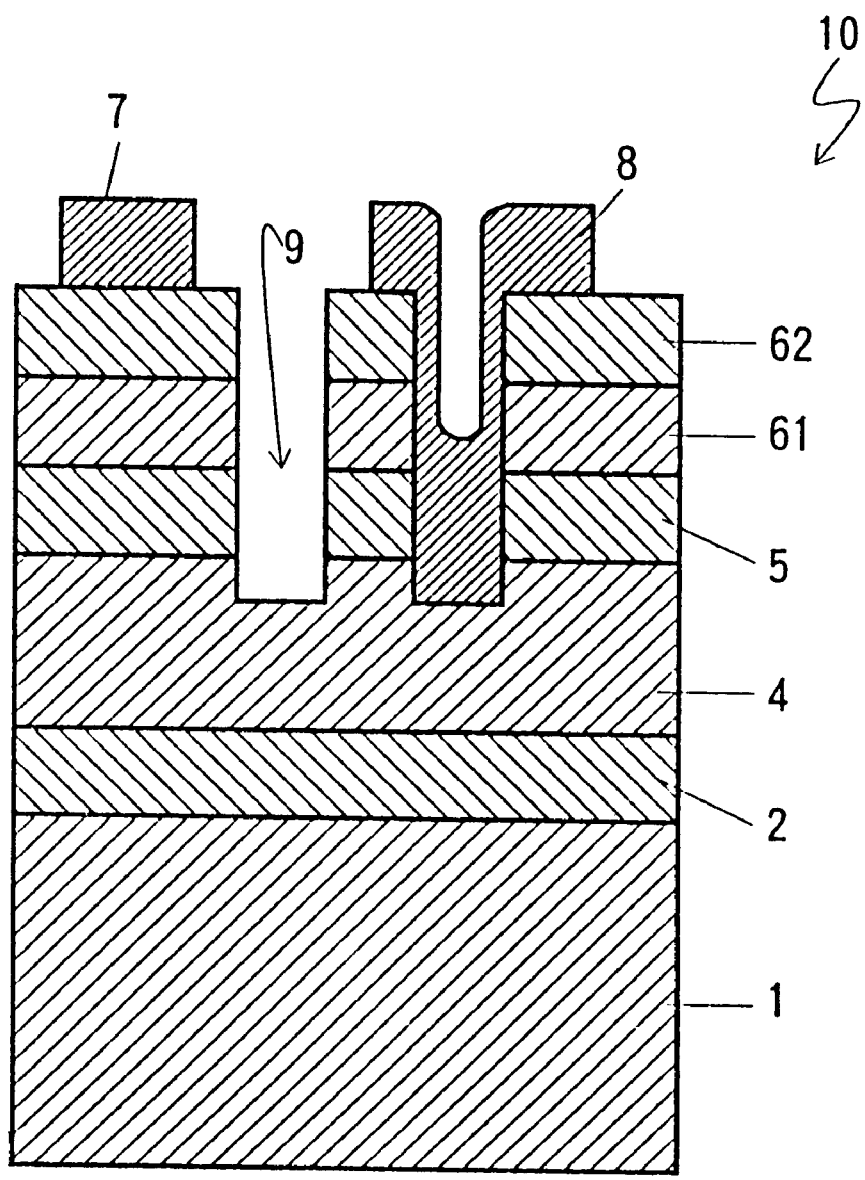
FIG. 11 is a diagram showing the structure of the LED embodied in Example 5.

FIG. 11 shows a LED 10 embodied in this example. Three layers, a p-layer 61, an emission layer 5, and an n$^+$-layer 4, are unique to Example 5. The p-layer 61 is formed of Mg-doped $Al_{x1}Ga_{1-x1}N$. The emission layer 5 is Zn- and Si-doped $Al_{x2}Ga_{1-x2}N$. The n$^+$-layer 4 of high carrier concentration is Si-doped $Al_{x3}Ga_{1-x3}N$. Other layers and electrodes are formed the same as those described in Example 4. The composition ratio of x1, x2 and x3 in each layer is designed to make the band gap of the emission layer 5 smaller than those of the n$^+$-layer 4 and p-layer 61 forming a double hetero-junction structure or a single hetero-junction structure. Thanks to this structure, carriers are confined in the emission layer 5 contributing to higher luminous intensity. The emission layer 5 can exhibit any one of semi-insulative, p-type conductivity, or n-type conductivity.

EXAMPLE 6

Figure 12:
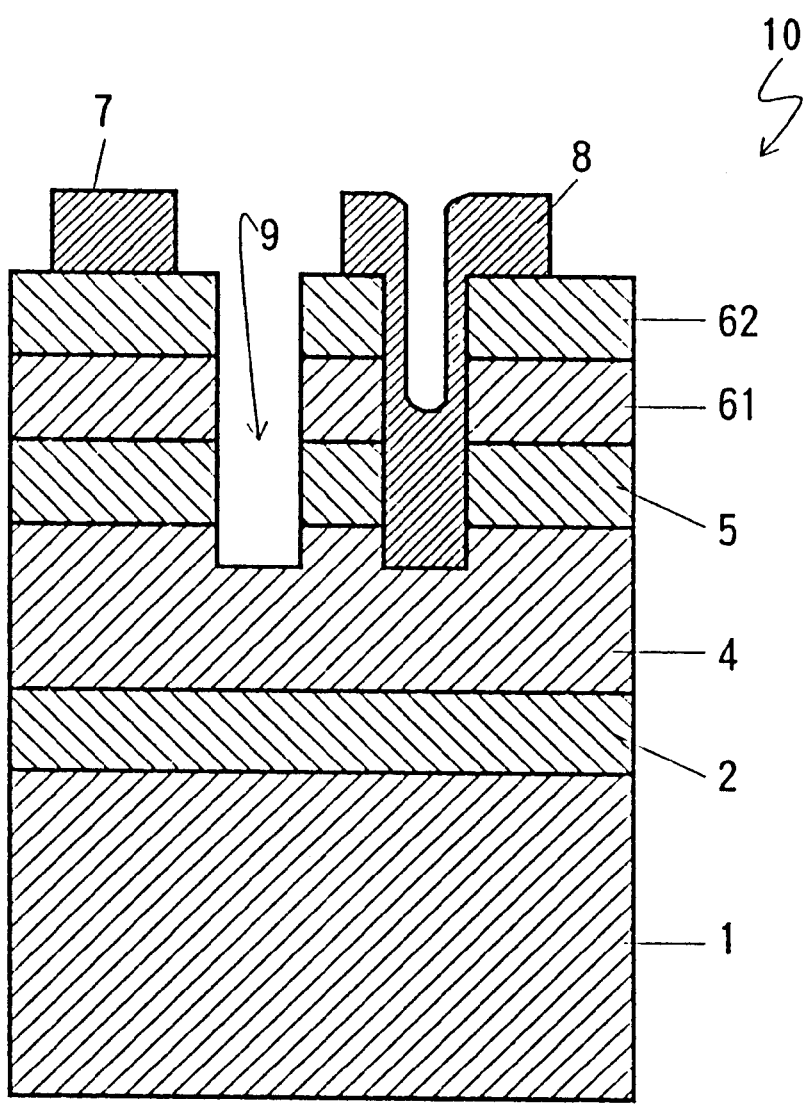
FIGS. 12 and 13 are diagrams showing the structure of the LED embodied in Example 6.
Figure 13:
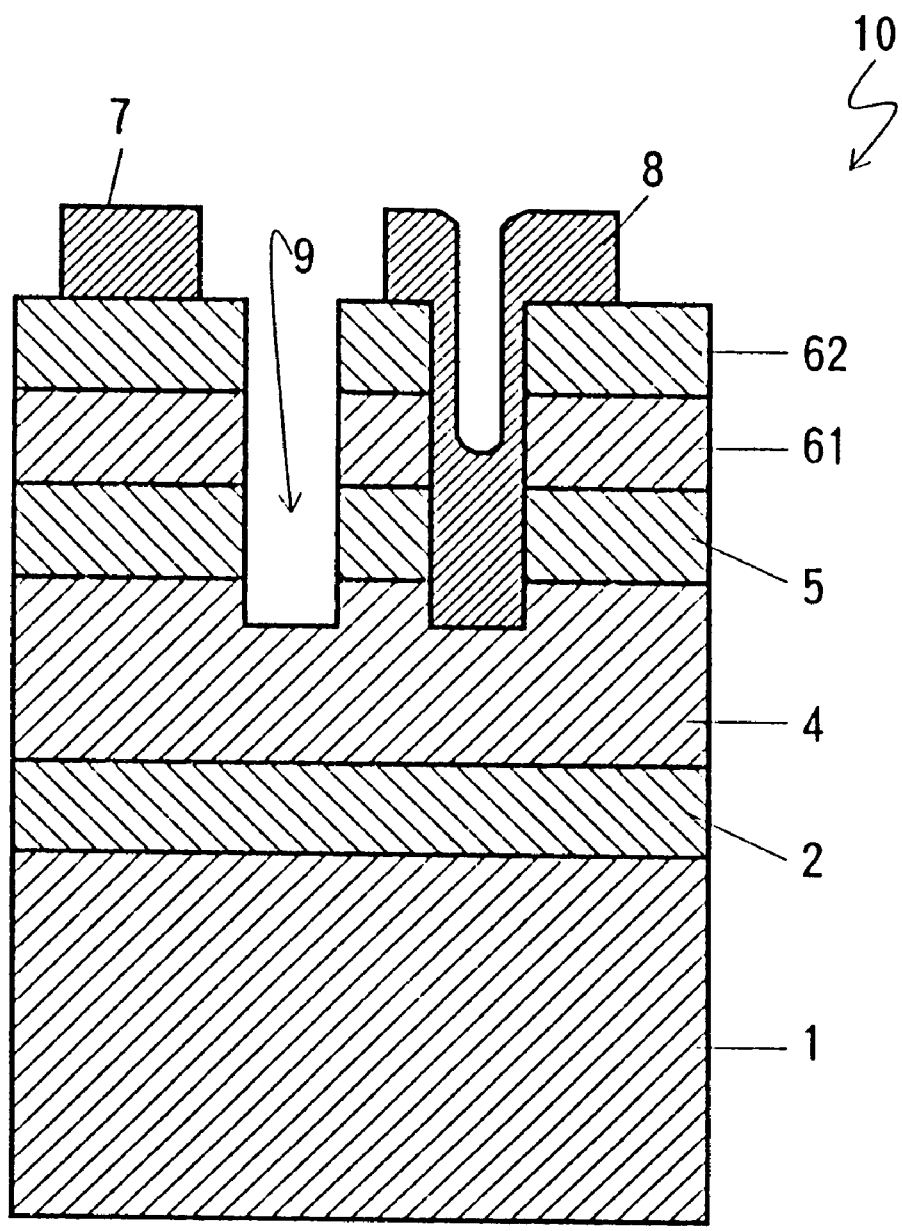

FIG. 12 shows a LED 10 embodied in this example. Three layers, a p-layer 61, an emission layer 5, and an n$^+$-layer 4, are unique to Example 6. The p-layer 61 formed of Mg-doped $Al_{x1}Ga_{1-x1}N$. The emission layer 5 is formed of Zn- and Si-doped $Ga_yIn_{1-y}N$. The n$^+$-layer 4 of high carrier concentration is formed of Si-doped $Al_{x2}Ga_{1-x2}N$. Other layers and electrodes are formed the same as those described in Example 4. The composition ratio of x1, x2, and x3 in each layer is designed to make the band gap of the emission layer 5 smaller than those of the n$^+$-layer 4 and p-layer 61 forming a double hetero-junction structure or a single hetero-junction structure. Thanks to this structure, carriers are confined in the emission layer 5 contributing to higher luminous intensity. The emission layer 5 can exhibit any one of semi-insulative, p-type conductivity, or n-type conductivity.

The LED 10 in this example has a sapphire substrate 1 which has the following five layers are consecutively formed thereon: an AlN buffer layer 2; a Si-doped $Al_{x2}Ga_{1-x2}N$ n$^+$-layer 4 of high carrier (n-type) concentration; a Zn- and Si-doped $Ga_{0.94}In_{0.06}N$ emission layer 5, Mg-doped $Al_{0.1}Ga_{0.9}N$ p-layer 61 of p-type, and an Mg-doped GaN contact layer 62 of p-type. The AlN layer 2 has a 500 Å thickness. The $Al_{x2}Ga_{1-x2}N$ n$^+$-layer 4 has about a 4.0 $\mu$m thickness and a $2\times10^{18}/cm^3$ electron concentration. The emission layer 5 has about 0.5 $\mu$m thickness. The p-layer 61 has about a 0.5 $\mu$m thickness and a $2\times10^{17}/cm^3$ hole concentration. The contact layer 62 has about a 0.5 $\mu$m thickness and a $2\times10^{17}/cm^3$ hole concentration. Nickel electrodes 7 and 8 are formed to connect to the contact layer 62 and n$^+$-layer 4 of high carrier concentration, respectively. The two electrodes are electrically insulated by a groove 9.

A manufacturing process for the LED 10 of FIG. 12 is as follows. The sapphire substrate 1 and the AlN buffer layer 2 were prepared by the same process described in detail in Example 1. On the AlN buffer layer 2, about a 4.0 $\mu$m thick Si-doped $Al_{x2}Ga_{1-x2}N$ n$^+$-layer 4 of high carrier concentration with an electron concentration of $2\times10^{18}/cm^3$ was formed under conditions of lowering the temperature in the chamber to 1150° C., keeping it constant, and supplying $N_2$, $NH_3$, TMG, TMA, and diluted silane to 0.86 ppm by $H_2$ for 60 min. at a flow rate of 20 liter/min., 10 liter/min., 1.12$\times$ 10$^{-4}$ mol/min., 0.47$\times$10$^{-4}$ mol/min., and 10$\times$10$^{-9}$ mol/min., respectively.

Following manufacturing process and composition ratio for the three layers, the emission layer 5 as an active layer, the p-layer 61 as a clad layer, and the contact layer 62, show an example where the LED 10 is designed to have 450 nm wavelength at peak in luminous spectrum and have luminous centers of Zn and Si.

About a 0.5 $\mu$m thick Zn- and Si-doped $Ga_{0.94}In_{0.06}N$ emission layer 5 was formed on the n$^+$-layer 4 under conditions of raising the temperature in the chamber to 850° C., keeping it constant, and supplying $N_2$ or $H_2$, $NH_3$, TMG, TMI, DMZ and, silane for 60 min. at a flow rate of 20 liter/min., 10 liter/min., 1.53$\times$10$^{-4}$ mol/min., 0.02$\times$10$^{-4}$ mol/min., 2$\times$10$^{-7}$ mol/min., and 10$\times$10$^{-9}$ mol/min., respectively.

About a 0.5 $\mu$m thick Mg-doped $Al_{0.1}Ga_{0.9}N$ p-layer 61 was formed on the emission layer 5 under conditions of raising the temperature in the chamber to 1000° C., keeping the temperature constant and supplying $N_2$ or $H_2$, $NH_3$, TMG, TMA, and $CP_2Mg$ for 7 min. at a flow rate of 20 liter/min., 10 liter/min., 1.12$\times$10$^{-4}$ mol/min., 0.47$\times$10$^{-4}$ mol/min., and 2$\times$10$^{-7}$ mol/min., respectively. At this stage, the p-layer 61 remained insulative with a resistivity of $10^8$ $\Omega\cdot$cm or more. The impurity concentration of the Mg doped into the p-layer 61 was $1\times10^{19}/cm^3$.

Then, about a 0.5 $\mu$m thick Mg-doped GaN contact layer 62 was formed on the p-layer 61 under conditions of keeping the temperature in the chamber at 1000° C. and supplying $N_2$ or $H_2$, $NH_3$, TMG, and $CP_2Mg$ for 10 min. at a flow rate of 20 liter/min., 10 liter/min., 1.12$\times$10$^{-4}$ mol/min., and 2$\times$10$^{-4}$ mol/min., respectively. At this stage, the Mg-doped contact layer 62 remained insulative with a resistivity of $10^8$ $\Omega\cdot$cm or more. The impurity concentration of the Mg doped into the contact layer 62 was $1\times10^{20}/cm^3$.

Then, the p-layer 61 and contact layer 62 were uniformly irradiated by an electron beam with the same conditions described in Example 1. Consequently, the p-layer 61 and contact layer 62 are processed to exhibit p-type conduction with a $2\times10^{17}/cm^3$ hole concentration and a 2 $\Omega\cdot$cm resistivity. The subsequent process steps of forming the electrodes is the same as that described in the previous example.

In Examples 1 to 6, the emission layer 5 can exhibit any one of semi-insulation, p-type conductivity, or n-type conductivity. When the concentration of the Zn-doped to the emission layer 5 is higher than that of the Si, the layer 5 exhibits semi-insulative characteristics. When the concentration of the Zn is smaller than that of the Si, the emission layer 5 exhibits n-type conduction.

In order to improve the luminous intensity, the impurity concentration of Zn and Si doped to the emission layer 5 is preferably in the $1\times10^{17}/cm^3$ to $1\times10^{20}/cm^3$ range, respectively. The concentration is more preferably in the $1\times10^{18}/cm^3$ to $1\times10^{19}/cm^3$ range. It is not preferable that the impurity concentration be lower than $1\times10^{18}/cm^3$, because the luminous intensity of the LED decreases as a result. It is not desirable that the impurity concentration is higher than $1\times10^{19}/cm^3$, because poor crystallinity occurs. It is preferable that the concentration of Si is ten to one-tenth as that of Zn. The most preferable concentration of Si is in the one to one-tenth range or closer to one-tenth to Zn.

In Examples 1 to 6, Cd, Zn, and Mg were employed as acceptor impurities and Si as a donor impurity. Alternatively, beryllium (Be) and mercury (Hg) can be used as an acceptor impurity. Alternatively, carbon (C), germanium (Ge), tin (Sn), lead (Pb), sulfur (S), selenium (Se), and tellurium (Te) can be used as a donor impurity.

Electron irradiation was used in Examples 1 to 6 in order to process an emission layer 5 to exhibit p-type conduction. Alternatively, annealing, heat processing in the atmosphere of $N_2$ plasma gas and laser irradiation can be used.

EXAMPLE 7

Figure 14:
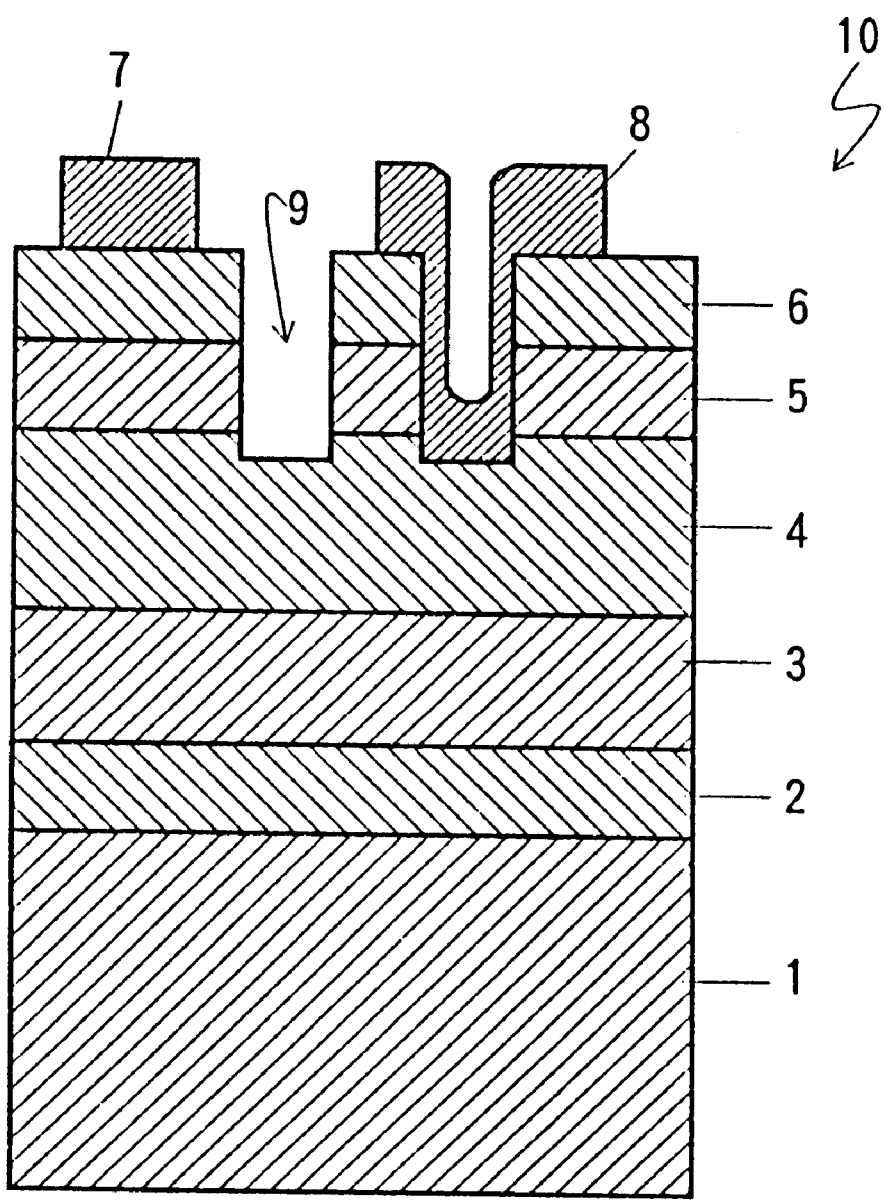
FIG. 14 is a diagram showing the structure of the LED embodied in Example 7.

FIG. 14 shows a structural view of a LED 10 embodied in Example 7. The LED 10 in this example was manufactured by additionally doping Mg to the emission layer 5 of the LED 10 in Example 1. Other layers and electrodes were manufactured the same way as those described in Example 1.

$CP_2Mg$ was fed at a flow rate of $2\times10^{-7}$ mol/min. into a chamber in addition to gasses employed in Example 1 in order to manufacture the emission layer 5 in Example 7. The emission layer 5 was about a 0.5 $\mu$m thick including Mg-, Cd-, and Si-doped $(Al_{0.09}Ga_{0.91})_{0.99}In_{0.01}N$ remaining high insulative. Impurity concentration of the Mg, Cd and Si was $1\times10^{20}/cm^3$, $5\times10^{18}/cm^3$, and $1\times10^{18}/cm^3$, respectively.

Then, electron beam was uniformly irradiated on both of the emission layer 5 and p-layer 6 with an electron diffraction device under the same conditions as in Example 1. The emission layer 5 and p-layer 6 came to exhibit p-type conduction with a hole concentration of $2\times10^{17}/cm^3$ and a resistivity of 2 $\Omega\cdot$cm.

EXAMPLE 8

Figure 15:
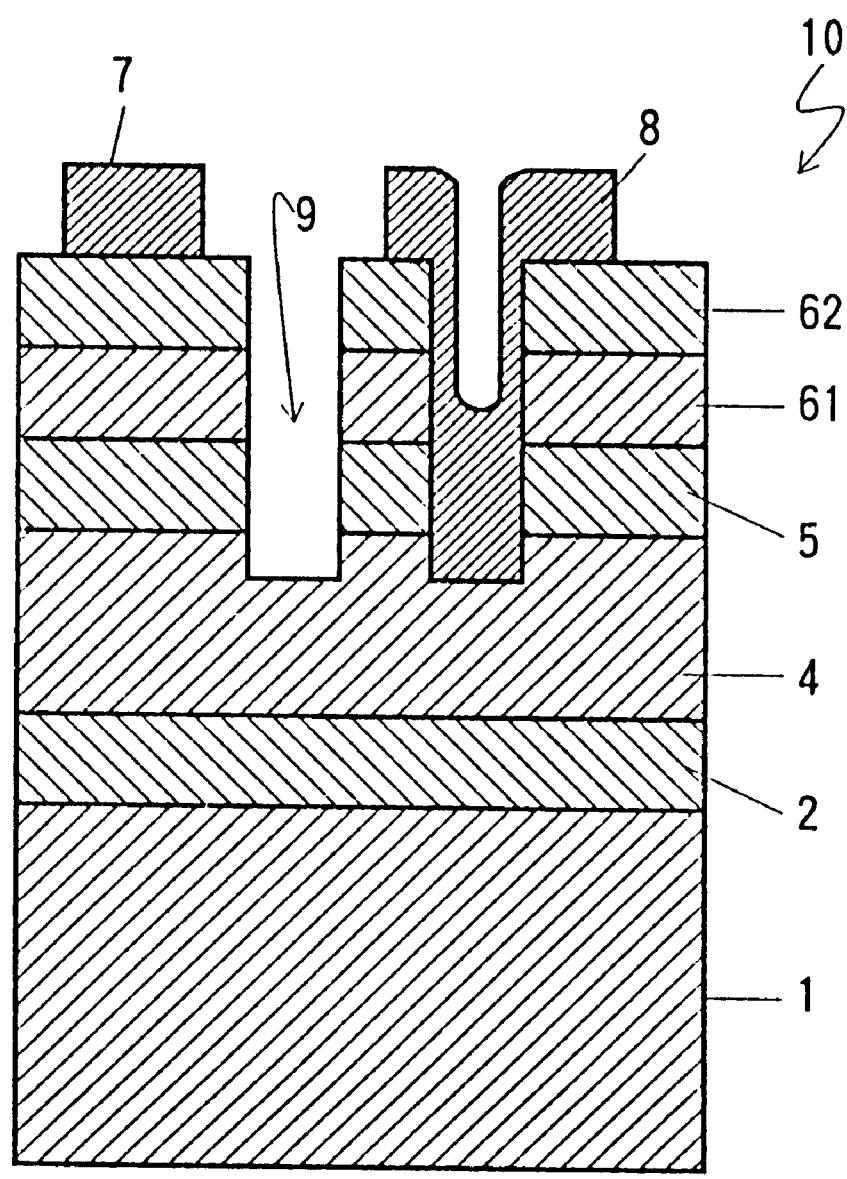
FIGS. 15 and 16 are diagrams showing the structure of the LED embodied in Example 8.
Figure 16:
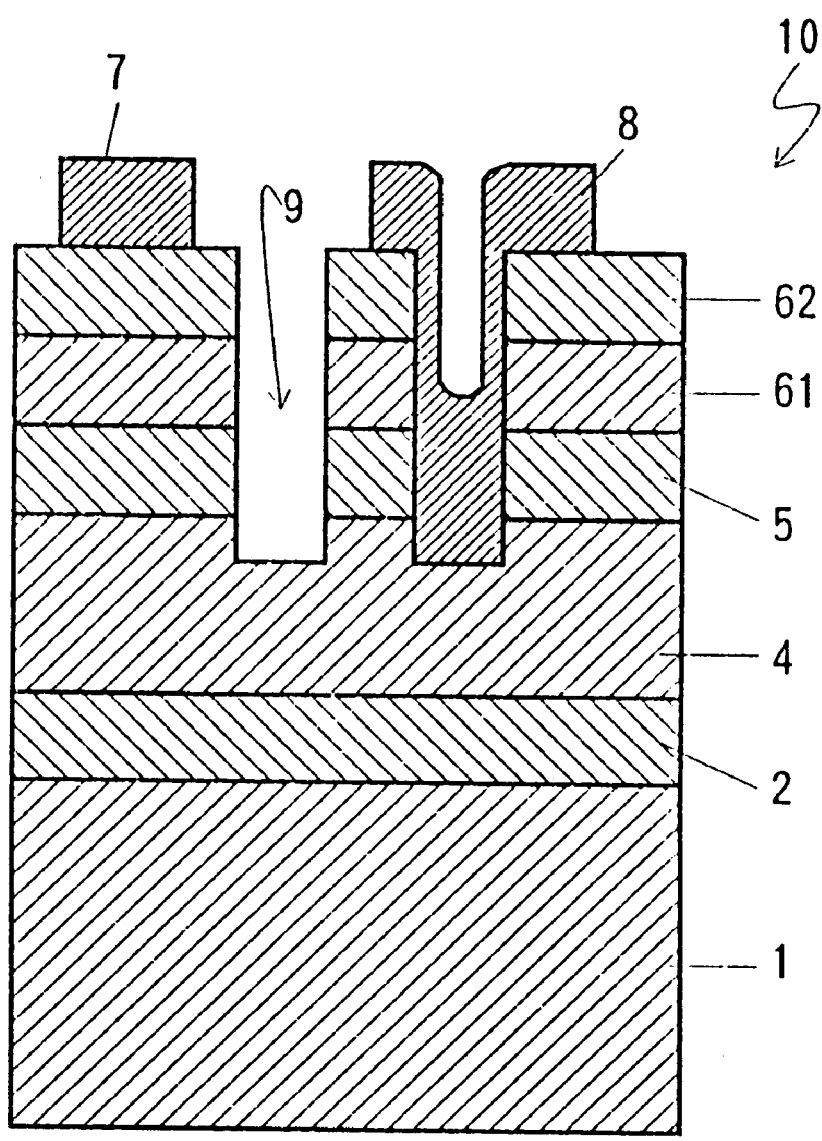

FIGS. 15 and 16 show structural views of a LED 10 embodied in Example 8. The LED 10 in this example was manufactured by additionally doping Mg and irradiating electrons into the emission layer 5 of the LED 10 in Example 6. The emission layer 5 of Example 8 includes Mg-, Zn-, and Si-doped $Ga_yIn_{1-y}N$ exhibiting p-type conduction. Other layers and electrodes were manufactured the same way as those described in Example 1.

FIG. 16 shows an example where the LED 10 is designed to have a 450 nm wavelength at peak in the luminous intensity. The manufacturing process and composition equation of the three layers, the emission layer 5 as an active layer, the p-layer 61 as a clad layer and the contact layer 62 are described hereinafter.

The $CP_2Mg$ was fed at a flow rate of $2\times10^{-4}$ mol/min. into a chamber in addition to gasses employed in Example 6 in order to manufacture the emission layer 5 in Example 8. The emission layer 5 was about a 0.5 µm thick including Mg-, Zn-, and Si-doped $Ga_{0.94}In_{0.06}N$ remaining highly insulative.

Then, the emission layer 5, p-layer 61 and contact layer 61 were uniformly irradiated by an electron diffraction device under the same conditions as those described in Example 1. This irradiation changed the emission layer 5, p-layer 61, and contact layer 62 into layers exhibiting p-type conduction with a hole concentration of $2 \times 10^{17}/cm^3$ and a resistivity of 2 Ω·cm.

In Examples 7 and 8, the impurity concentration of Zn and Si doped into the emission layer 5 are preferably in the $1 \times 10^{17}/cm^3$ to $1 \times 20^{20}/cm^3$ range, respectively. The concentration is more preferably in the $1 \times 10^{18}/cm^3$ to $1 \times 10^{19}/cm^3$ range. It is not preferable that the impurity concentration be lower than $1 \times 10^{18}/cm^3$, because luminous intensity of the LED decreases as a result. It is not desirable that the impurity concentration be higher than $1 \times 10^{19}/cm^3$, because poor crystallinity occurs. It is further preferable that the concentration of Si be ten to one-tenth as same as that of Zn. The most preferable concentration of Si is in the two to one-tenth range.

In Examples 7 and 8, Cd, Zn and Mg were employed as acceptor impurities and Si as a donor impurity. Alternatively, beryllium (Be) and mercury (Hg) can be used as an acceptor impurity. Alternatively, carbon (C), germanium (Ge), tin (Sn), lead (Pb), sulfur (S), selenium (Se) and tellurium (Te) can be used as a donor impurity.

Electron irradiation was used in Examples 7 and 8 in order to change. layers to have p-type conduction. Alternatively, annealing, heat process in the atmosphere of $N_2$ plasma gas, laser irradiation and any combination thereof can be used.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A light-emitting semiconductor device comprising:

an $N^+$-layer of N-type conduction of group III nitride compound semiconductor;

an N-layer of N-type conduction of group III nitride compound semiconductor satisfying the formula $Al_{x2}Ga_{y2}In_{1-x2-y2}N$, where $0 \leq x2 \leq 1$, $0 \leq y2 \leq 1$, and $0 \leq x2+y2 \leq 1$ with a low electron concentration formed on said $N^+$-layer, said N-layer having a valence band;

an emission layer of group III nitride compound semiconductor satisfying the formula $Al_{x3}Ga_{y3}In_{1-x3-y3}N$, where $0 \leq x3 \leq 1$, $0 \leq y3 \leq 1$, and $0 \leq x3+y3 \leq 1$;

a P-layer of P-type conduction of group III nitride compound semiconductor satisfying the formula $Al_{x4}Ga_{y4}In_{1-x4-y4}N$, where $0 \leq x4 \leq 1$, $0 \leq y4 \leq 1$, and $0 \leq x4+y4 \leq 1$, said P-layer having a conduction band;

a P-electrode emission layer, and an N-electrode;

wherein a band width of said N-layer is smaller than a band width of said P-layer and an electrical potential barrier of the valence band of said N-layer is lower than an electrical potential barrier of the conduction band of said P-layer.

2. A light-emitting semiconductor device according to claim 1, wherein said $N^+$-layer is doped with Si.

3. A light-emitting semiconductor device according to claim 2, wherein said P-layer is doped with Mg.

4. A light-emitting semiconductor device according to claim 1, wherein said P-layer is doped with Mg.

5. A light-emitting semiconductor device according to claim 1, wherein said N-electrode is Ni.

6. A light-emitting semiconductor device according to claim 1, wherein said P-electrode is Ni.

7. A light-emitting semiconductor device according to claim 1, further comprising:

a sapphire substrate, and a buffer layer formed on said sapphire substrate, said $N^+$-layer being formed on said buffer layer.

8. A light-emitting semiconductor device according to claim 1, wherein said $N^+$-layer is formed with GaN.

9. A light-emitting semiconductor device comprising:

an $N^+$-layer of N-type conduction of group III nitride compound semiconductor, the $N^+$-layer having formed thereon an N-layer of N-type conduction of group III nitride compound semiconductor satisfying the formula $Al_{x2}Ga_{y2}In_{1-x2-y2}N$, where $0 \leq x2 \leq 1$, $0 \leq y2 \leq 1$, and $0 \leq x2+y2 \leq 1$ with a low electron concentration, the N-layer having a valence band;

an emission layer of group III nitride compound semiconductor satisfying the formula $Al_{x3}Ga_{y3}In_{1-x3-y3}N$, where $0 \leq x3 \leq 1$, $0 \leq y3 \leq 1$, and $0 \leq x3+y3 \leq 1$, the emission layer being formed on the N-layer;

a P-layer of P-type conduction of group III nitride compound semiconductor satisfying the formula $Al_{x4}Ga_{y4}In_{1-x4-y4}N$, where $0 \leq x4 \leq 1$, $0 \leq y4 \leq 1$, and $0 \leq x4+y4 \leq 1$, the P-layer being formed on the emission layer and having a conduction band formed thereon;

a P-electrode; and an N-electrode;

wherein a band width of the N-layer is smaller than a band width of the P-layer and an electrical potential barrier of the valence band of the N-layer is lower than an electrical potential barrier of the conduction band of the P-layer.

* * * * *

UNITED STATES PATENT AND TRADEMARK OFFICE
CERTIFICATE OF CORRECTION

PATENT NO. : 6,265,726 B1
DATED : July 24, 2001
INVENTOR(S) : Manabe et al.

It is certified that error appears in the above-identified patent and that said Letters Patent is hereby corrected as shown below:

Column 12,
Line 3, please delete "emission layer".

Signed and Sealed this

Tenth Day of September, 2002

Attest:

Attesting Officer

JAMES E. ROGAN
Director of the United States Patent and Trademark Office